(12) United States Patent
Matsuno et al.

(10) Patent No.: US 11,714,107 B2
(45) Date of Patent: Aug. 1, 2023

(54) VOLTAGE DIVIDER CIRCUIT, A NEGATIVE FEEDBACK CIRCUIT, AND A POWER-ON RESET CIRCUIT

(71) Applicant: RENESAS ELECTRONICS CORPORATION, Tokyo (JP)

(72) Inventors: Noriaki Matsuno, Tokyo (JP); Shingo Sakamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/666,918

(22) Filed: Feb. 8, 2022

(65) Prior Publication Data

US 2022/0268810 A1    Aug. 25, 2022

(30) Foreign Application Priority Data

Feb. 25, 2021  (JP) ................................ 2021-028126

(51) Int. Cl.
*G01R 15/06* (2006.01)

(52) U.S. Cl.
CPC .................................... *G01R 15/06* (2013.01)

(58) Field of Classification Search
CPC ............ G01R 15/06; G05F 1/46; H02M 3/07; H02M 3/158; H03K 17/223
USPC ........................................................ 324/126
See application file for complete search history.

(56) References Cited

U.S. PATENT DOCUMENTS

| 5,734,366 | A | 3/1998 | Kubota et al. |
| 6,259,612 | B1 | 7/2001 | Itoh |
| 9,236,794 | B2 | 1/2016 | Lesso |
| 2013/0082684 | A1* | 4/2013 | Spalding, Jr. .......... G01R 15/06 324/111 |
| 2016/0112042 | A1 | 4/2016 | Hanson et al. |

FOREIGN PATENT DOCUMENTS

| JP | 08-335059 A | 12/1996 |
| JP | 3773718 B2 | 5/2006 |

OTHER PUBLICATIONS

Extended European Search Report issued in corresponding European Patent Application No. 22155853.9-1012, dated Jul. 8, 2022.
Texas Instruments "LP3470 Tiny Power On Reset Circuit", https://www.tij.co.jp/jp/lit/ds/symlink/lp3470.pdf, originally referred to inventor on Jun. 5, 2020 and English translation.

* cited by examiner

*Primary Examiner* — Farhana A Hoque
(74) *Attorney, Agent, or Firm* — McDermott Will & Emery LLP (57) ABSTRACT

A voltage divider circuit includes: a first voltage divider having first and second capacitors, and an output node configured to output a divider voltage from between the first and second capacitors; a second voltage divider having third and fourth capacitors, and first to third switches, and being connected in parallel to the first voltage divider; and a fourth switch provided between the output node and a connection node of the third and fourth capacitors. In the voltage divider circuit, the switches are controlled based on controlling periods.

7 Claims, 12 Drawing Sheets

VOLTAGE DIVIDER CIRCUIT, A NEGATIVE FEEDBACK CIRCUIT, AND A POWER-ON RESET CIRCUIT

CROSS-REFERENCE TO RELATED APPLICATIONS

The disclosure of Japanese Patent Application No. 2021-028126 filed on Feb. 25, 2021 including the specification, drawings and abstract is incorporated herein by reference in its entirety.

BACKGROUND

The present invention relates to a voltage divider circuit, a negative feedback circuit, and a power-ON reset circuit.

There are disclosed techniques listed below.
[Patent Document 1] Japanese Unexamined Patent Application Publication No. H08-335059
[Patent Document 2] Japanese Patent No. 3773718
[Non-Patent Document 1] Texas Instruments Incorporated. "LP3470 Tiny Power ON Reset Circuit". [online]http://www.tij.co.jp/jp/lit/ds/symlink/lp3470.pdf Patent Document 1 discloses a signal amplifier including a voltage divider circuit created in a form of a semiconductor film such as a silicon thin-film. FIG. 21 of Patent Document 1 shows a signal amplifier circuit including a resistive voltage divider circuit as a conventional technique.

Non-Patent Document 1 discloses a typical configuration of a power-ON reset circuit using a resistive voltage divider circuit. A standby current of a low current-consumption microcontroller unit (MCU) is approximately 1 □A in total, and it is considered that approximately 10% (0.1 □A) is used for monitoring a power-supply voltage (VDD). In such a case, when the power-supply voltage is set to 3.3 V, the required resistance value becomes 33 MOhm, and a large circuit area would be required.

In addition, Patent Document 2 discloses a step-up circuit including a capacitor-voltage divider circuit, and a step-down circuit. In a case where the capacitor-voltage divider is used, there is no steady power consumption, and the circuit area can be reduced compared to a case where the resistive voltage divider is used. In Patent Document 2, since an output voltage of the capacitor voltage divider circuit drifts by a leakage current, the resistive voltage divider circuit is intermittently operated to compensate for the drift. This intermittent operation allows a time average value for the current consumption of the resistive voltage divider circuit to be small. Note that, although the current consumption is added by a clock for performing the intermittent operation, it is considered to be small.

Using the technique disclosed in Patent Document 2 makes it possible to reduce the circuit area and power consumption compared to a case where the resistive voltage divider is used. However, this level of current consumption and circuit area required to realize a simple voltage dividing function is not sufficient, and further reduction in the current consumption and circuit area is desired.

SUMMARY

It is desired that circuits such as the power-ON reset circuit and a regulator for a retention memory that operates in a standby state of the MCU operate at a current consumption of about 10 nA. These circuits require a voltage divider circuit to monitor signals or to generate a feedback signal. In the conventional technique using the resistive voltage divider, in order to achieve the current consumption of about 10 nA, there is a problem in which it would be necessary to sacrifice the circuit area or use a special optional process.

On the other hand, the technique disclosed in Patent Document 2 aims to achieve low current consumption and miniaturization by mainly using a capacitor voltage divider circuit having no steady current consumption. However, since this technique uses a resistive voltage divider circuit that intermittently operates to compensate for the drift generated in the capacitor voltage divider circuit, there is still a problem in which a large circuit area is required in order to achieve a current consumption of about 10 nA.

In addition, in the step-up circuit shown in FIG. 1 of Patent Document 2, the leakage current from the capacitor occurs mainly at a switch SW2. In a case where the resistive voltage divider circuit is not operated, since a voltage between the terminals of the switch SW2 is equal to a divider voltage, generation of the leakage current is inevitable. Therefore, according to the technique disclosed in Patent Document 2, it is necessary to increase the operation frequency of the resistive voltage divider circuit to compensate for the drift caused by the leakage current, or increase the capacitance values of the capacitors C1 and C2 to minimize the drift caused by the leakage. However, the former would lead to an increase in the current consumption, while the latter would lead to an increase in the circuit area.

Other objects and novel characteristics will be apparent from the description of the present specification and accompanying drawings.

According to one embodiment, a voltage divider circuit comprises: a first voltage divider including a first capacitor and a second capacitor connected in series between an input potential and a reference potential, and an output node configured to output a divider voltage from between the first capacitor and the second capacitor; a second voltage divider including a third capacitor and a fourth capacitor having substantially the same capacitance ratio as the first capacitor and the second capacitor, a first switch, a second switch connected in parallel to the third capacitor, and a third switch connected in parallel to the fourth capacitor, the third capacitor, the fourth capacitor and the first switch being connected in series and being connected in parallel to the first voltage divider; and a fourth switch provided between the output node and a connection node of the third capacitor and the fourth capacitor. In a first period, the first switch is controlled in a non-conductive state, the second switch and the third switch are controlled in a conductive state, and the fourth switch is controlled in a non-conductive state. In a second period after the first period, the first switch is controlled in a conductive state, the second switch and the third switch are controlled in a non-conductive state, and the fourth switch is controlled in a non-conductive state. In a third period after the second period, the first switch is controlled in a conductive state, the second switch and the third switch are controlled in a non-conductive state, and the fourth switch is controlled in a conductive state. In a fourth period after the third period, the first switch is controlled in a conductive state, the second switch and the third switch are controlled in a non-conductive state, and the fourth switch is controlled in a non-conductive state.

According to one embodiment, it is possible to achieve miniaturization or low current consumption of the voltage divider circuit.

DETAILED DESCRIPTION

The following description and drawings have portions that are accordingly omitted or simplified for the sake of clarity. In addition, each element described in the drawings as a functional block that performs various processes can be configured in hardware such as a CPU, memory or any other circuit, and in software such as a program loaded in the memory. Therefore, it is understood by those skilled in the art that such a functional block can be achieved in various ways, including but not limited to hardware alone, software alone, or a combination thereof. Note that, in each of the drawings, the same elements are denoted by the same reference signs, and redundant descriptions thereof are omitted as appropriate.

In addition, the above-described program can be stored in various types of non-transitory computer readable media to be supplied to a computer. The non-transitory computer readable medium includes various types of tangible storage media. Examples of non-transitory computer readable media include a magnetic storage medium (such as a flexible disk, a magnetic tape or a hard disk drive), a magneto-optical storage medium (such as a magneto-optical disk), CD-ROM (Read Only Memory), CD-R, CD-R/W, and a semiconductor memory (such as a mask ROM, a PROM (programmable ROM), an EPROM (erasable PROM), a flash ROM or a RAM (Random Access Memory)). In addition, the program may be supplied to the computer by various types of transitory computer readable media. Examples of transitory computer readable media include electrical signals, optical signals, and electromagnetic waves. The transitory computer readable medium can supply a program to the computer via a wired communication channel such as an electrical wire or an optical fiber, or a wireless communication channel.

First Embodiment

Figure 1:
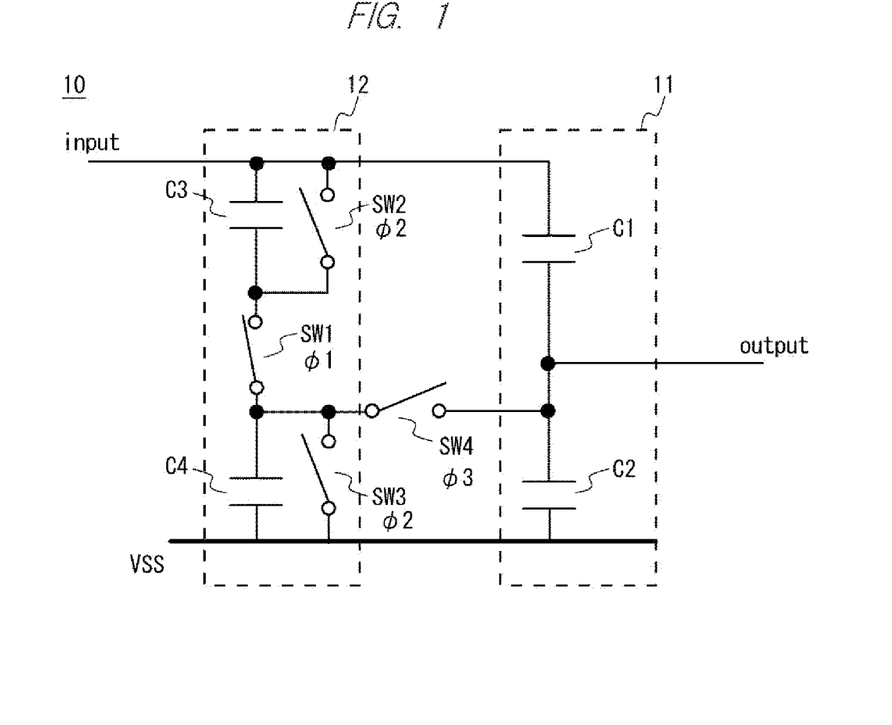
FIG. 1 is a drawing showing a configuration of a voltage divider circuit according to a first embodiment.

Hereinafter, a configuration of a voltage divider circuit according to a first embodiment will be described with reference to FIG. 1. FIG. 1 is a drawing describing a configuration of a voltage divider circuit 10. The voltage divider circuit 10 comprises a first voltage divider 11 including a capacitor C1, a capacitor C2 and a voltage node "output", a second voltage divider 12 including a capacitor C3, a capacitor C4, a switch SW1, a switch SW2 and a switch SW3, and a switch SW4. The voltage divider circuit 10 may further comprise a controller configured to control conductive and non-conductive states of the switches SW1, SW2, SW3 and SW4.

The first voltage divider 11 comprises the capacitor C1, the capacitor C2 and the output node "output". The capacitor C1 is also referred to as a first capacitor. The capacitor C2 is also referred to as a second capacitor. The capacitor C1 and the capacitor C2 are connected in series between an input potential "input" and a reference potential VSS. The output node "output" outputs a divider voltage from between the capacitor C1 and the capacitor C2. In other words, the voltage divider node "output" outputs the divider voltage obtained by dividing the input potential "input" by a capacitance ratio of the capacitor C1 and the capacitor C2. The capacitances of the capacitors C1 and C2 are selected so that a predetermined voltage divider ratio can be obtained. The leakage causes the divider voltage to drift with time.

The second voltage divider 12 comprises the capacitor C3, the capacitor C4, the switch SW1, the switch SW2 and the switch SW3. The switch SW1 is also referred to as a first switch. The switch SW2 is also referred to as a second switch. The switch SW3 is also referred to as a third switch.

The switch SW2 is connected in parallel to the capacitor C3. The switch SW3 is connected in parallel to the capacitor C4. When the switch SW2 is controlled in a conductive state, the charge accumulated in the capacitor C3 is reset (discharged). When the switch SW3 is controlled in a conductive state, the charge accumulated in the capacitor C4 is reset.

The capacitor C3, the capacitor C4 and the switch SW1 are connected in series, and are connected in parallel to the first voltage divider 11 (that is, the capacitors C1 and C2). As shown in FIG. 1, the switch SW1 may be provided between the capacitor C3 and the capacitor C4. In addition, the switch SW1 may be provided between the input potential "input" and the capacitor C3, or between the reference potential VSS and the capacitor C4.

The capacitance ratio of the capacitor C3 and the capacitor C4 is substantially the same as the capacitance ratio of the capacitors C1 and C2. Here, the capacitance ratios need not be completely the same. After the switch SW2 and the switch SW3 are controlled in a non-conductive state and when the switch SW1 is controlled in a conductive state, the capacitor C3 and the capacitor C4 are charged. Then, the potential of the connection node between the capacitor C3 and the capacitor C4 becomes substantially the same as the potential of the output node "output" of the first voltage divider 11.

The switch SW4 is provided between the output node "output" of the first voltage divider 11 and the connection node between the capacitor C3 and the capacitor C4 of the second voltage divider 12. When the switch SW4 is controlled in a conductive state, the second voltage divider 12 can be used to compensate for the output voltage of the first voltage divider 11.

The conductive states of the switches SW1, SW2, SW3 and SW4 are controlled such that a period T1, a period T2, a period T3 and a period T4 described below are repeated. The period T1 is also referred to as a first period, the period T2 is also referred to as a second period, the period T3 is also referred to as a third period, and the period T4 is also referred to as a fourth period.

Figure 2:
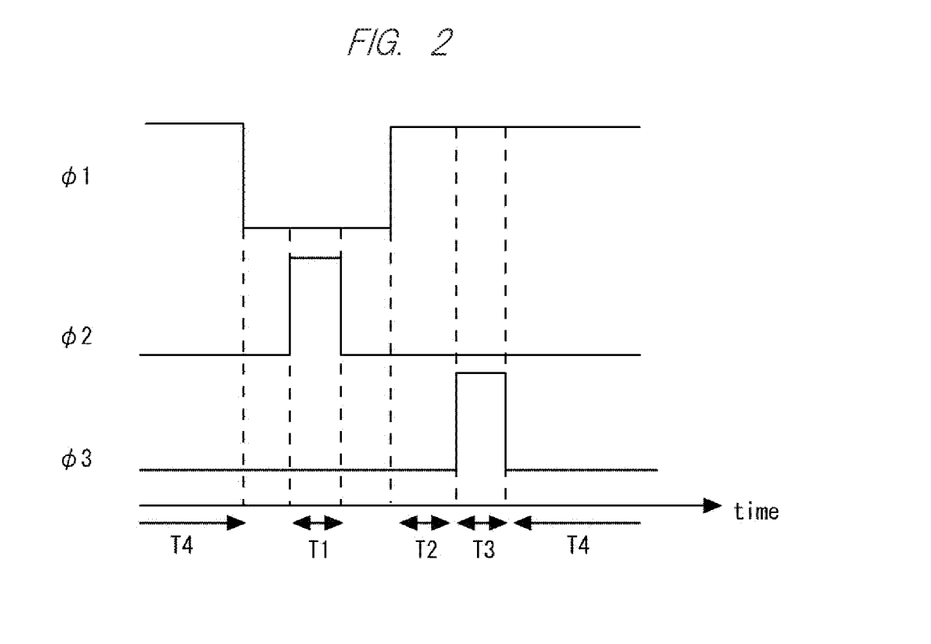
FIG. 2 is a drawing showing control signals inputted to the voltage divider circuit.

FIG. 2 is a drawing showing a timing chart of the control signals φ1, φ2 and φ3 that control the switches SW1, SW2, SW3 and SW4. The control signal φ1 is a control signal for controlling the switch SW1. The control signal φ2 is a control signal for controlling the switches SW2 and SW3. The control signal φ3 is a control signal for controlling the switch SW4.

The control signals φ1, φ2 and φ3 control the switches SW1, SW2 and SW3 in a conductive state when they are at a high level, and control the switches SW1, SW2 and SW3 in a non-conductive state when they are at a low level. The operation chart includes the period T1, the period T2, the period T3 and the period T4.

In the period T1, the control signal φ1 is at a low level, the control signal φ2 is at a high level, and the control signal φ3 is at a low level. Therefore, the switch SW1 is controlled in a non-conductive state, the switch SW2 and the switch SW3 are controlled in a conductive state, and the switch SW4 is controlled in a non-conductive state. In the period T1, charges of the capacitor C3 and the capacitor C4 of the second voltage divider 12 are discharged.

In the period T2 after the period T1, the control signal φ1 is at a high level, the control signal φ2 is at a low level, and the control signal φ3 is at a low level. Therefore, the switch SW1 is controlled in a conductive state, the switches SW2 and SW3 are controlled in a non-conductive state, and the switch SW4 is controlled in a non-conductive state. As a result, the capacitors C3 and C4 are charged, and the second voltage divider 12 generates the divider voltage.

In the period T3 after the period T2, the control signal φ1 is at a high level, the control signal φ2 is at a low level, and the control signal φ3 is at a high level. Therefore, the switch SW1 is controlled in a conductive state, the switches SW2 and SW3 are controlled in a non-conductive state, and the switch SW4 is controlled in a conductive state. As a result, the divider voltage generated in the period T2 compensates for the output voltage of the first voltage divider 11.

In the period T4 after the period T3, the control signal φ1 is at a high level, the control signal φ2 is at a low level, and the control signal φ3 is at a low level. Therefore, the switch SW1 is controlled in a conductive state, the switches SW2 and SW3 are controlled in a non-conductive state, and the switch SW4 is controlled in a non-conductive state. As a result, the divider voltage of the first voltage divider 11 and the divider voltage of the second voltage divider 12 are kept independent from each other. After the period T4, the state of the voltage divider circuit 10 returns to the state in the period T1.

According to the voltage divider circuit of the first embodiment, it is possible to achieve both low power consumption and miniaturization. Hereinafter, reasons for achieving these effects will be described from two viewpoints.

The first reason for achieving the effects is that the current consumption in the reset switches SW2 and SW3 is small. Here, the product of the discarded charge associated with the resetting of the capacitors C3 and C4 and a reset frequency (frequency) is the current consumption associated with the voltage divider operation. Hereinafter, a case where areas of the capacitor C3 and the capacitor C4 are sufficiently small and the capacitance value is 0.2 pF will be considered. Assuming that VDD is 3.3 V and the reset frequency is 1 kHz, the current consumption will be a sufficiently small value at (0.2 pF/0.2 pF)*3.3 V*1 kHz=0.33 nA. Therefore, according to the voltage divider circuit 10, it is possible to achieve both miniaturization and low power consumption of the circuit.

The second reason for achieving the effects is that the leakage current of the first voltage divider 11 constituted by the capacitors C1 and C2 is small. The period T4 in which the first voltage divider 11 and the second voltage divider 12 independently hold the voltage accounts for a large proportion within one cycle (periods T1 to T4) of operation. In the period T4, only a slight potential difference caused by a difference in leakage exists between the divider voltage of the first voltage divider 11 and the divider voltage of the second voltage divider 12. Therefore, the leakage current of the switch SW4 controlled in a non-conductive state in the period T4 is suppressed to be small, and the charge of the capacitors C1 and C2 can be retained for a long period. By using this to reduce the compensation frequency for the voltage drift, it is possible to reduce current consumption in the voltage divider circuit 10. In addition, by using smaller capacitors C1, C2, C3 and C4 with the compensation frequency set to meet the required voltage drift criteria, it is possible to achieve miniaturization and low current consumption of the circuit.

First Modification Example

Hereinafter, the voltage divider circuit according to a first modification example of the first embodiment will be described with reference to FIGS. 3 and 4. In the voltage divider circuit 10 according to the first modification example, the capacitor C1 and the capacitor C2 are MOS (Metal Oxide Semiconductor) capacitors that can be made smaller in area. The MOS capacitor is a capacitor constituted by a MOS transistor. In addition, in the voltage divider circuit according to the first modification example, the capacitors C3 and C4 are MOM (Metal Oxide Metal) capacitors that have good precision and small bias dependence.

Figure 3:
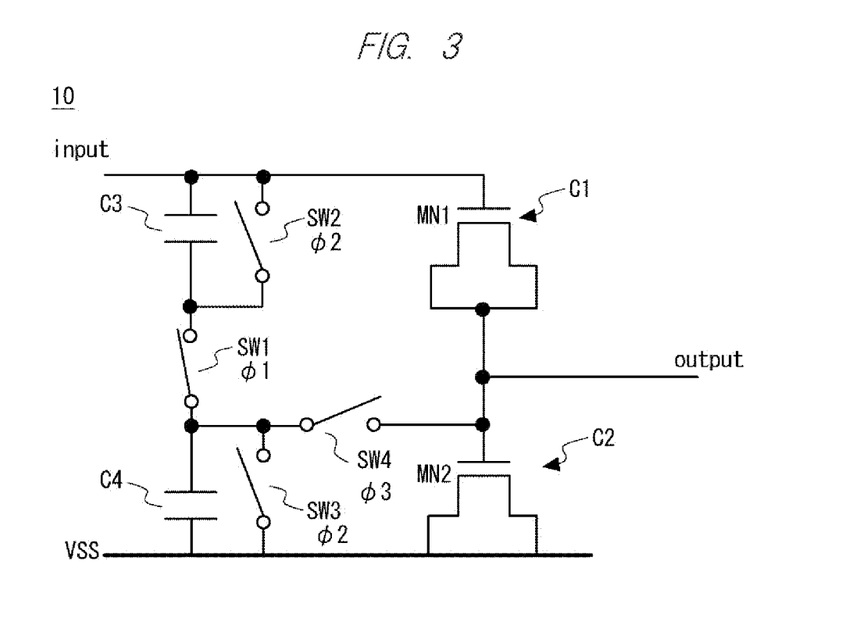
FIG. 3 is a drawing showing a configuration example of the voltage divider circuit according to a first modification example of the first embodiment.
Figure 4:
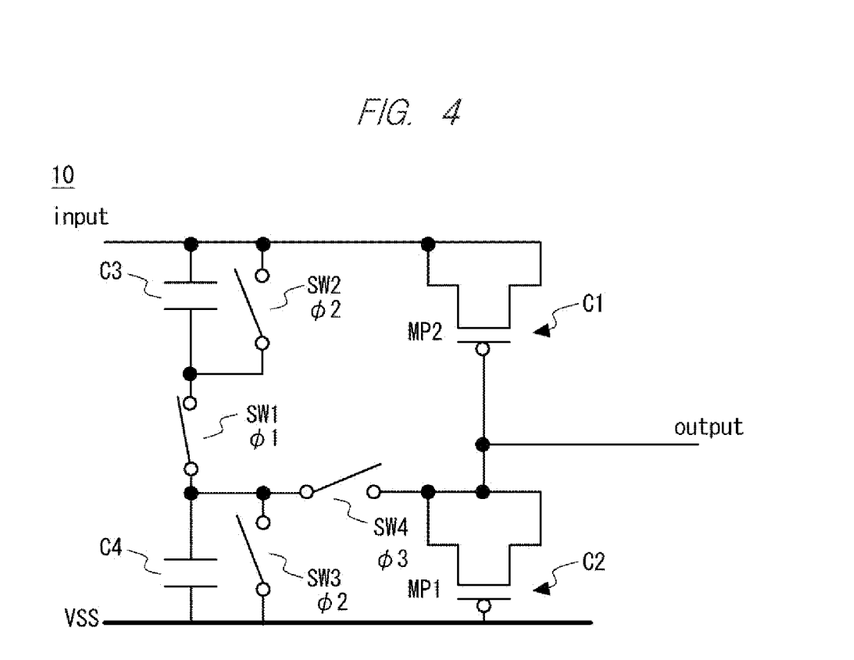
FIG. 4 is a drawing showing a configuration example of the voltage divider circuit according to the first modification example of the first embodiment.

The capacitors C1 and C2 may both be nMOS capacitors as shown in FIG. 3, or may both be pMOS capacitors as shown in FIG. 4. In FIG. 3, the capacitor C1 is constituted by an nMOS transistor MN1, and the capacitor C2 is constituted by an nMOS transistor MN2. In FIG. 4, the capacitor C1 is constituted by a pMOS transistor MP2, and the capacitor C2 is constituted by a pMOS transistor MP1.

An error of the voltage divider ratio caused by a variation in the capacitance ratio of the capacitors C1 and C2 is suppressed by a compensation operation by the capacitors C3 and C4. On the other hand, it is desirable for the variation in the capacitance ratio of the capacitors C3 and C4 to be small since it directly affects the precision of the voltage divider ratio. In addition, it is required that the bias dependence of the capacitance value is small since charging is performed from a reset state.

In the voltage divider circuit 10 according to the first modification example, the capacitors C1 and C2 are MOS capacitors and the capacitors C3 and C4 are MOM capacitors. Therefore, it is possible to reduce the circuit area while maintaining accuracy of the voltage divider ratio.

Second Modification Example

Figure 5:
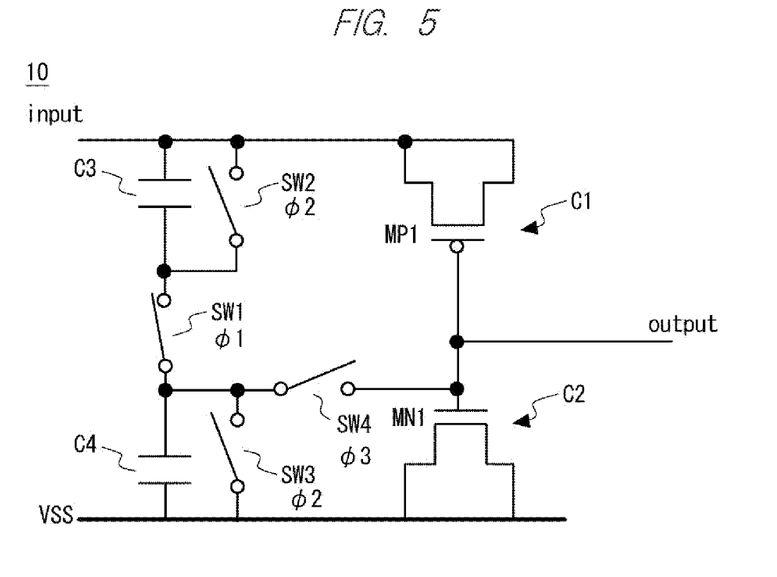
FIG. 5 is a drawing showing a configuration example of the voltage divider circuit according to a second modification example of the first embodiment.

Hereinafter, the voltage divider circuit according to a second modification example of the first embodiment will be described with reference to FIG. 5. The voltage divider circuit 10 according to the second modification example has a configuration according to the first modification example in which one of the MOS capacitors is an nMOS capacitor, and the other of the MOS capacitors is a pMOS capacitor. As shown in FIG. 5, the capacitor C1 is a pMOS capacitor constituted by the pMOS transistor MP1, and the capacitor C2 is an nMOS capacitor constituted by the nMOS transistor MN1. The output node "output" is a node in which a gate of the pMOS transistor MP1 and a gated of the nMOS transistor MN1 are connected.

In the voltage divider circuit according to the second modification example, the output node "output" is not connected to a diffusion layer of the MOS transistor, so that leakage of the charge in the MOS capacitor is suppressed. Since the capacitance value can be reduced by suppressing the leakage, or since the compensation frequency can be reduced, it is possible to achieve low power consumption and miniaturization of the circuit in the voltage divider circuit 10.

Third Modification Example

The voltage divider circuit 10 according to a third modification example has a configuration according to the first and second modification examples in which the MOS capacitor and the MOM capacitor are overlapped and arranged on a chip. As a result, it is possible to reduce the circuit area of the voltage divider circuit 10.

Specifically, for example, among the wiring layers of the chip, a wiring related to the MOS capacitor is formed in the first and second layers counted from the bottom. Then, a wiring related to the MOM capacitor is formed in the third and higher layers. The layers in which the wiring related to the MOS capacitor is formed and the layer in which the wiring related to the MOM capacitor is formed are overlapped. As a result, it is possible to reduce the circuit area of the voltage divider circuit 10.

Fourth Modification Example

Figure 6:
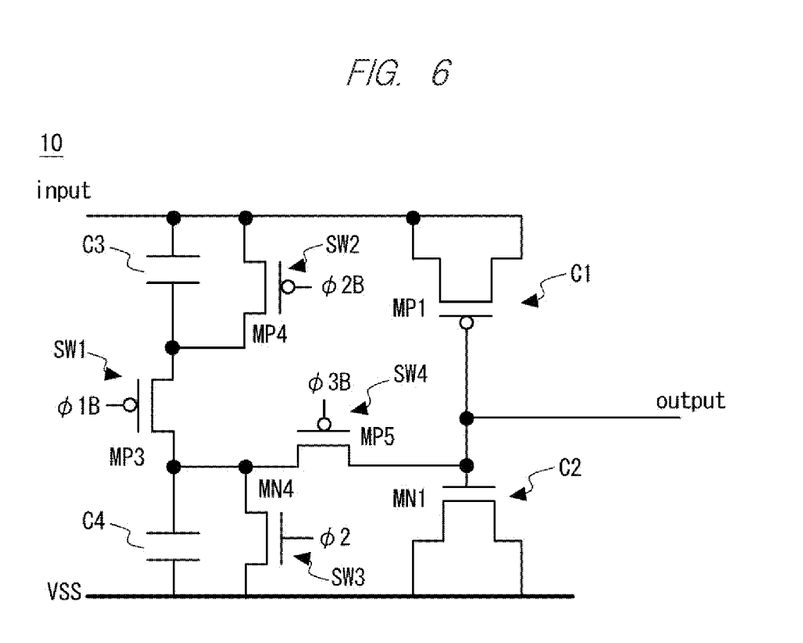
FIG. 6 is a drawing showing a configuration example of the voltage divider circuit according to a fourth modification example of the first embodiment.
Figure 7:
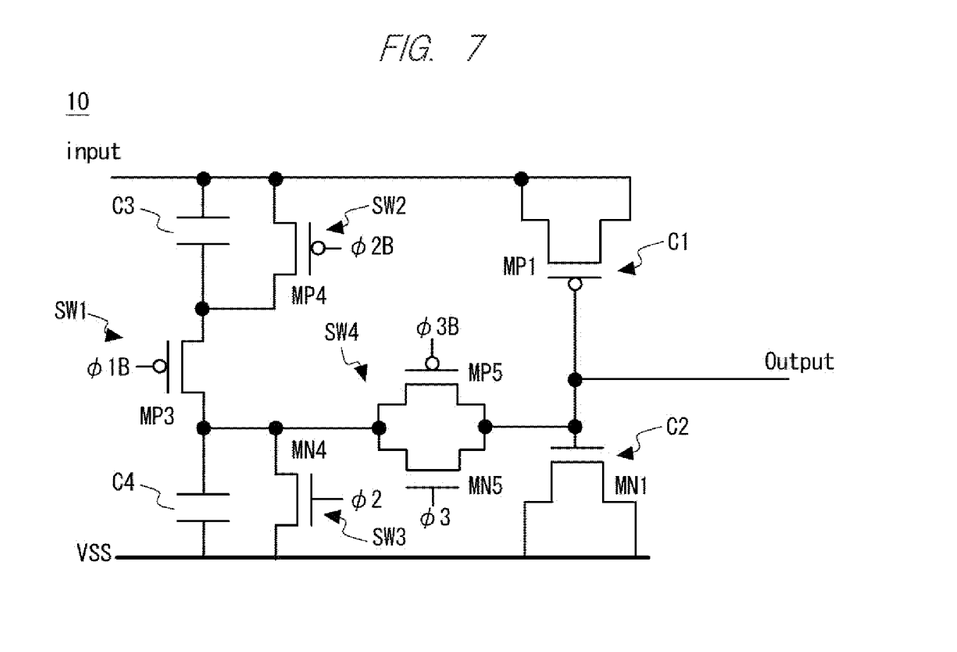
FIG. 7 is a drawing showing a configuration example of the voltage divider circuit according to the fourth modification example of the first embodiment.

Hereinafter, the voltage divider circuit according to a fourth modification example of the first embodiment will be described with reference to FIGS. 6 and 7. The voltage divider circuit 10 according to the fourth modification example has a configuration in which the switches SW1 to SW4 are realized by MOS transistors in the second modification example.

The configuration of each of the switches can be determined in view of the potential and element characteristics at the time of operation. In FIGS. 6 and 7, the switch SW1 is constituted by a pMOS transistor MP3, the switch SW2 is constituted by a pMOS transistor MP4, and the switch SW3 is constituted by an nMOS transistor MN4. The switch SW4 is constituted by a pMOS transistor MP5 in FIG. 6, and is constituted by a pMOS transistor MP5 and an nMOS transistor MN5 connected in parallel in FIG. 7.

When the switch is an nMOS transistor, a corresponding signal among the control signals φ1 to φ3 shown in FIG. 2 is inputted to the gate of the transistor constituting each of the switches. When the switch is a pMOS transistor, a corresponding signal among φ1B to φ3B complementary to the control signals φ1 to φ3 is inputted to the gate of the transistor.

Fifth Modification Example

Figure 8:
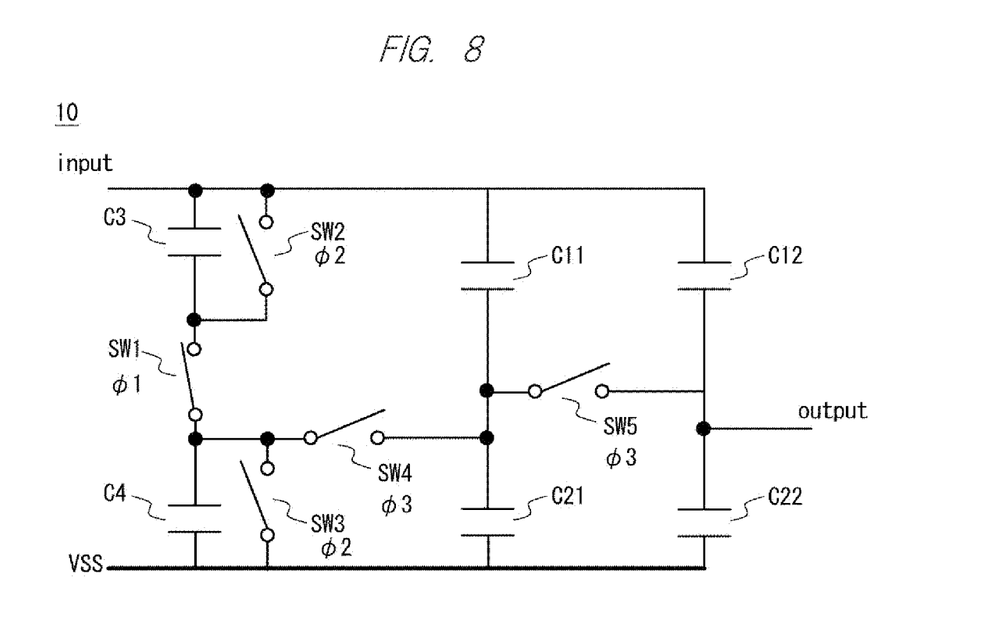
FIG. 8 is a drawing showing a configuration example of the voltage divider circuit according to a fifth modification example of the first embodiment.
Figure 9:
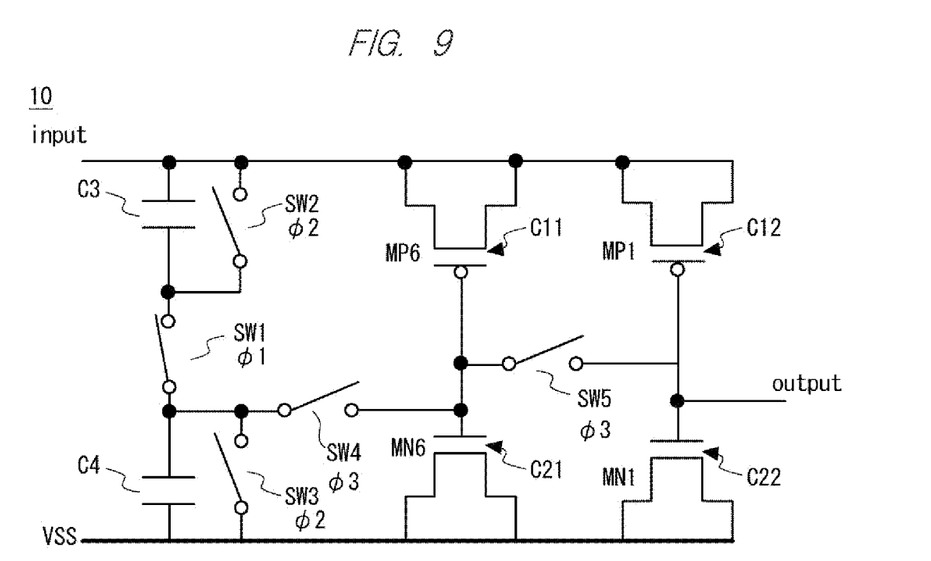
FIG. 9 is a drawing showing a configuration example of the voltage divider circuit according to the fifth modification example of the first embodiment.

Hereinafter, the voltage divider circuit according to a fifth modification example of the first embodiment will be described with reference to FIGS. 8 and 9. The voltage divider circuit 10 according to the fifth modification example is based on the configuration shown in FIG. 1, the configuration of the first modification example and the configuration of the second modification example, and has a configuration in which each of the capacitors C1 and C2 are divided into two capacitors, with a switch SW5 arranged between the divided capacitors. The configuration shown in FIG. 8 is based on the configuration shown in FIG. 1. The configuration shown in FIG. 9 is based on the configuration of the second modification example. The switch SW5 is controlled using the control signal φ3.

The capacitors C3 and C4 have the switch SW2 or SW3 connected in parallel in order to reset the charge. Therefore, the capacitors C1l and C21 to which no switch is connected have less leakage of the charge than the capacitors C3 and C4. Between the terminals of the switch SW5 controlled in a non-conductive (OFF) state in the above-described period T4, only a difference between a drift of the voltage of the connection node of the capacitor C11 and the capacitor C21, and a drift of the voltage of the connection point of the capacitor C12 and the capacitor C22 is applied. Therefore, the leakage of the charge in the capacitor C12 and the capacitor C22 is even smaller, and the voltage divider circuit 10 can make the drift of the outputted divider voltage smaller.

Sixth Modification Example

Hereinafter, the voltage divider circuit according to a sixth modification example of the first embodiment will be described with reference to FIG. 10. The voltage divider circuit according to the sixth modification example is based on the configuration shown in FIG. 1, the configuration of the first modification example and the configuration of the second modification example, and has a configuration in which the capacitor C1 is divided into an n number of capacitors C11 to C1n, the capacitor C2 is divided into an n number of capacitors C21 to C2n, and the switches SW5 to SW(n+3) are arranged between the capacitors having adjacent numbers. The switches SW5 to SW(n+3) are controlled using the control signal φ3. Each of the capacitors C1 and C2 is constituted by an n number (where n is an integer of two or more) of capacitors connected in parallel.

Figure 10:
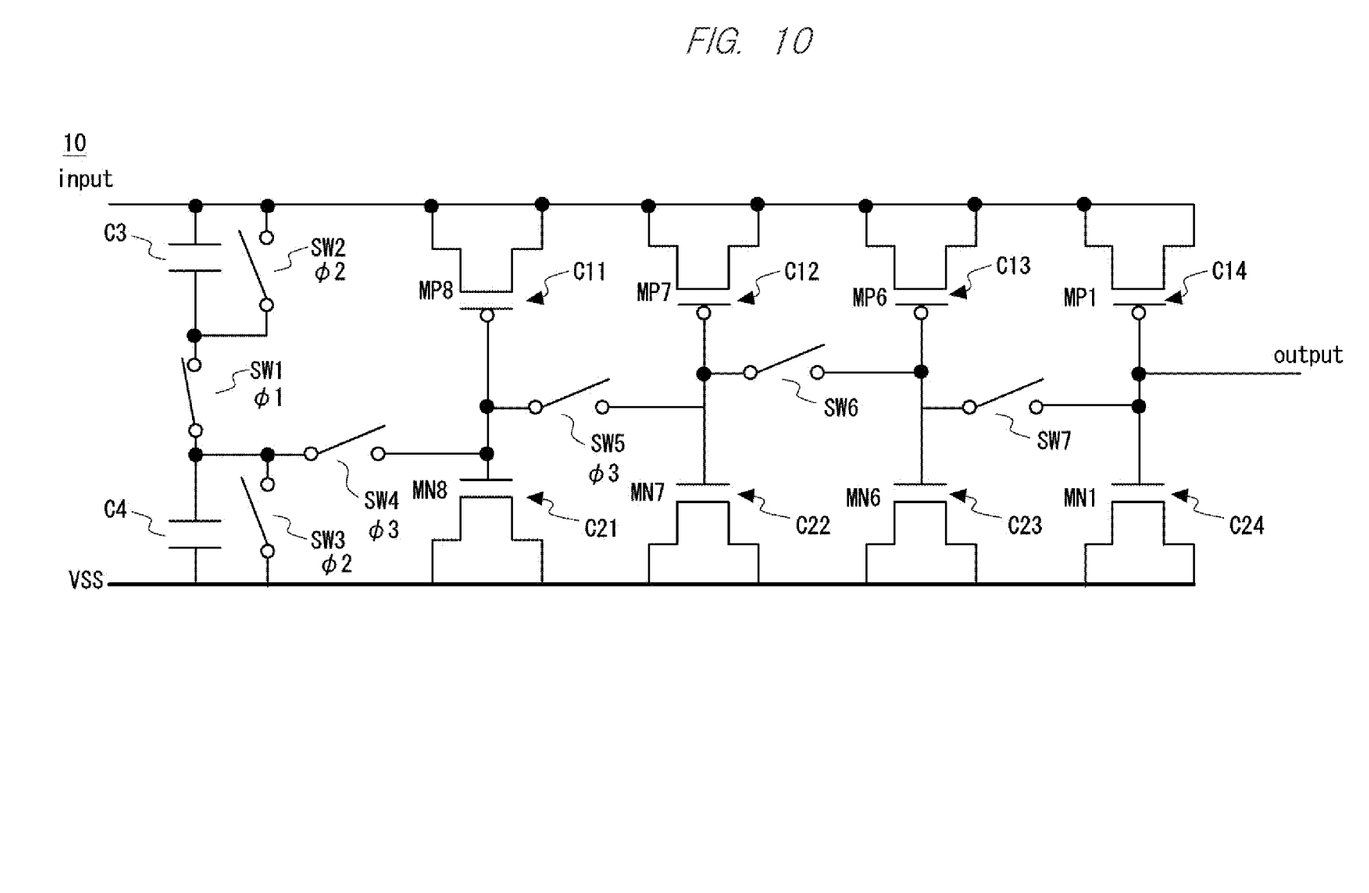
FIG. 10 is a drawing showing a configuration example of the voltage divider circuit according to a sixth modification example of the first embodiment.

FIG. 10 shows each of the capacitors C1 and C2 divided into four parts. The capacitors C11, C12, C13 and C14 are obtained by dividing the capacitor C1 into four parts, and are respectively constituted by the pMOS transistors MP8, MP7, MP6 and MP1. The capacitors C21, C22, C23 and C24 are obtained by dividing the capacitor C2 into four parts, and are respectively constituted by the nMOS transistors MN8, MN7, MN6 and MN1.

Each of the nodes connecting the capacitors C11 to C14 and the capacitors C21 to C24 is connected to an adjacent node via the switch SW5, SW6 or SW7. The switches SW5 to SW7 are controlled in the same conductive state as the switch SW4.

Selecting the optimum n number allows the voltage divider circuit according to the sixth modification example to further enhance the effect described in the fifth modification example.

Seventh Modification Example

Hereinafter, the voltage divider circuit according to a seventh modification example of the first embodiment will be described with reference to FIGS. 11 to 13. The voltage divider circuit according to the seventh modification example has a configuration in which an arrangement (insertion) point of the switch SW1 and a connection point of the switch SW4 on the capacitors C3 and C4 sides are changed from the configuration shown in FIG. 1. The insertion point and connection point have a degree of freedom and are design matters.

Figure 11:
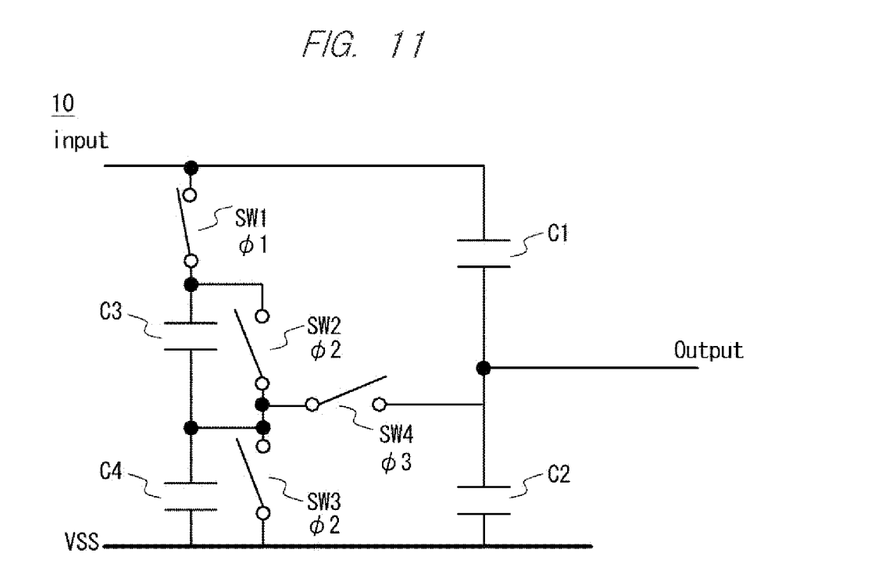
FIG. 11 is a drawing showing a configuration example of the voltage divider circuit according to a seventh modification example of the first embodiment.
Figure 12:
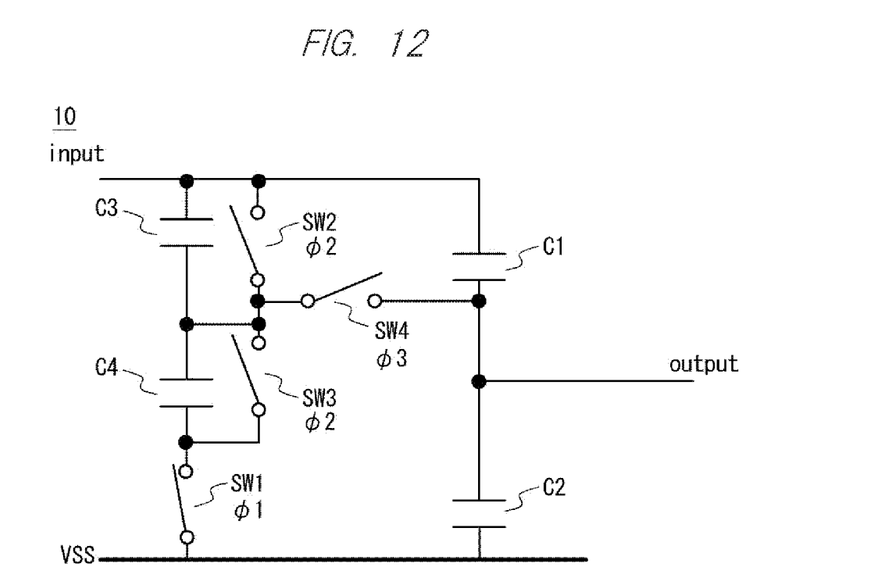
FIG. 12 is a drawing showing a configuration example of the voltage divider circuit according to the seventh modification example of the first embodiment.
Figure 13:
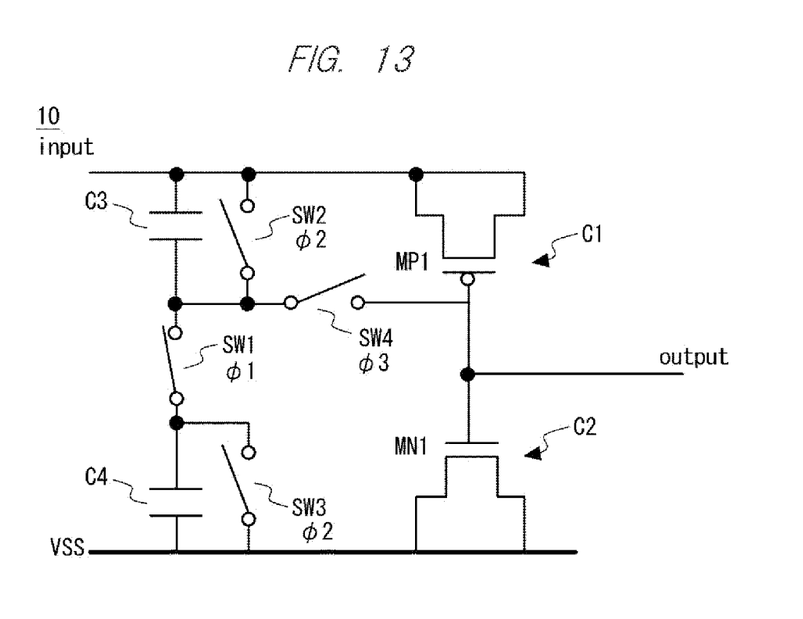
FIG. 13 is a drawing showing a configuration example of the voltage divider circuit according to the seventh modification example of the first embodiment.

The switch SW1 may be arranged between the input potential "input" and the capacitor C3 as shown in FIG. 11, or may be arranged between the capacitor C4 and the reference potential VSS as shown in FIG. 12, or may be arranged between the capacitors C3 and C4 as shown in FIG. 13. One end of the switch SW4 may be connected to the capacitor C4 side as shown in FIG. 1, or may be connected to the capacitor C3 side as shown in FIG. 13.

Eighth Modification Example

Figure 14:
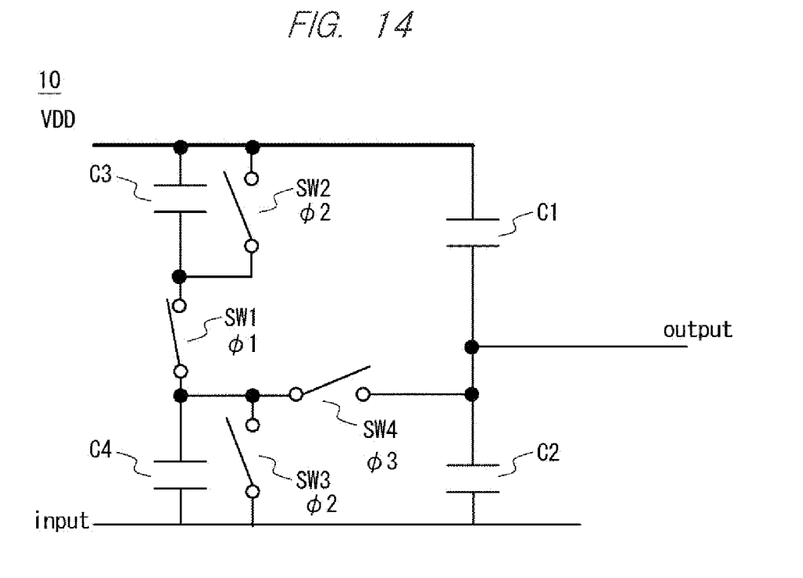
FIG. 14 is a drawing showing a configuration example of the voltage divider circuit according to an eighth modification example of the first embodiment.

Hereinafter, the voltage divider circuit according to an eighth modification example of the first embodiment will be described with reference to FIG. 14. Although a configuration in which the voltage divider circuit 10 operates with a VSS reference is shown in FIG. 1 and the modification examples, the voltage divider circuit 10 may also operate with a VDD reference. In addition, the voltage divider circuit 10 may operate with a fixed potential other than VDD or VSS as a reference. FIG. 14 is a drawing showing the voltage divider circuit that operates with a VDD reference.

Second Embodiment

Figure 15:
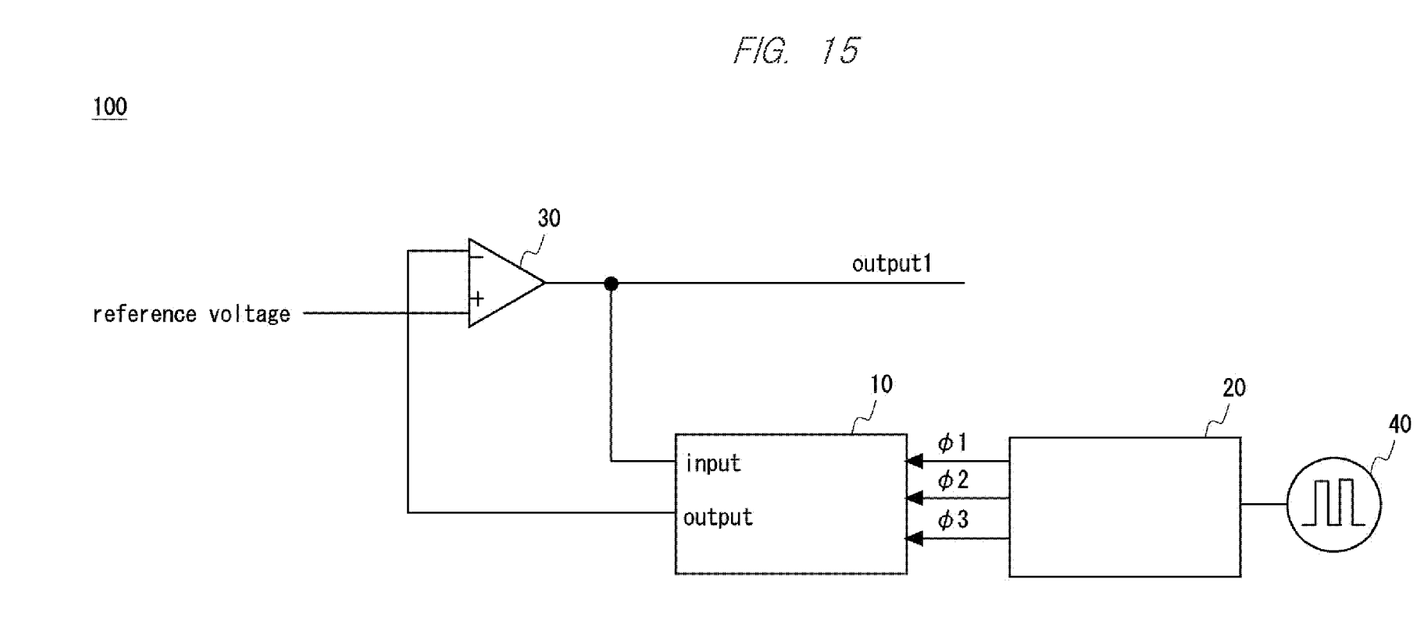
FIG. 15 is a drawing showing a configuration example of a negative feedback circuit according to a second embodiment.

FIG. 15 is a configuration diagram showing a configuration of a negative feedback circuit 100 using the voltage divider circuit according to the first embodiment. In the description of the second embodiment, components equivalent to those of the first embodiment are denoted by the same reference signs, and redundant descriptions thereof are omitted as appropriate. The negative feedback circuit 100 according to the second embodiment comprises the voltage divider circuit 10 according to the first embodiment, a controller 20, and an operational amplifier 30. The operational amplifier 30 is also referred to as a comparison amplifier.

An output "output 1" of the operational amplifier 30 is inputted to the voltage divider circuit 10 as an input potential (input voltage) "input". The voltage divider circuit 10 divides the inputted voltage. Then, the voltage divided by the voltage divider circuit 10 is inputted (fed back) to a negative input terminal (negative input) of the operational amplifier 30. The controller 20 generates the above-described control signals $\phi 1$, $\phi 2$ and $\phi 3$ from a clock generated by a clock source 40.

Figure 16:
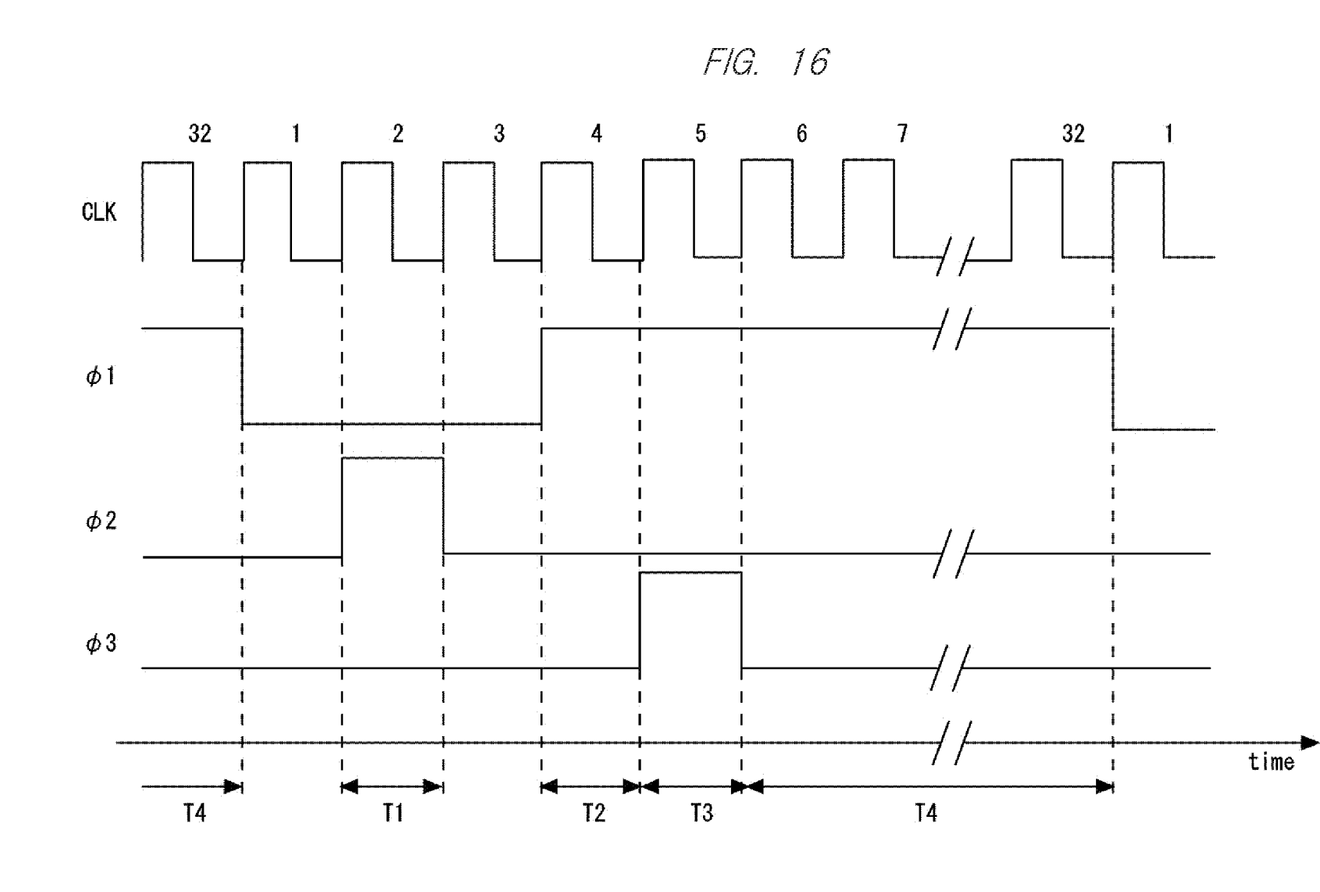
FIG. 16 is a drawing showing control signals inputted to the voltage divider circuit.

FIG. 16 is a timing chart showing an example of a clock CLK and waveforms of the control signals $\phi 1$ to $\phi 3$. Thirty-two cycles of the clock CLK corresponds to one cycle of operation. The numbers 1 to 32 shown for the clock CLK represent the number of clocks. A clock 1 corresponds to the above-described period T1. A clock 4 corresponds to the above-described period T2. A clock 5 corresponds to the above-described period T3. Clocks 6 to 32 correspond to the above-described period T4.

In FIG. 16, dead times (clock 3 and clock 1) are respectively provided between the period T1 and the period T2, and between the period T4 and the period T1 to prevent a through-current caused by the plurality of switches from switching simultaneously.

Further examples of the negative feedback circuit 100 include an LDO (Low Dropout) and a regulator. For example, the clock source 40 may be a 32 kHz LOCO (Low-Speed On-Chip Oscillator).

Figure 17:
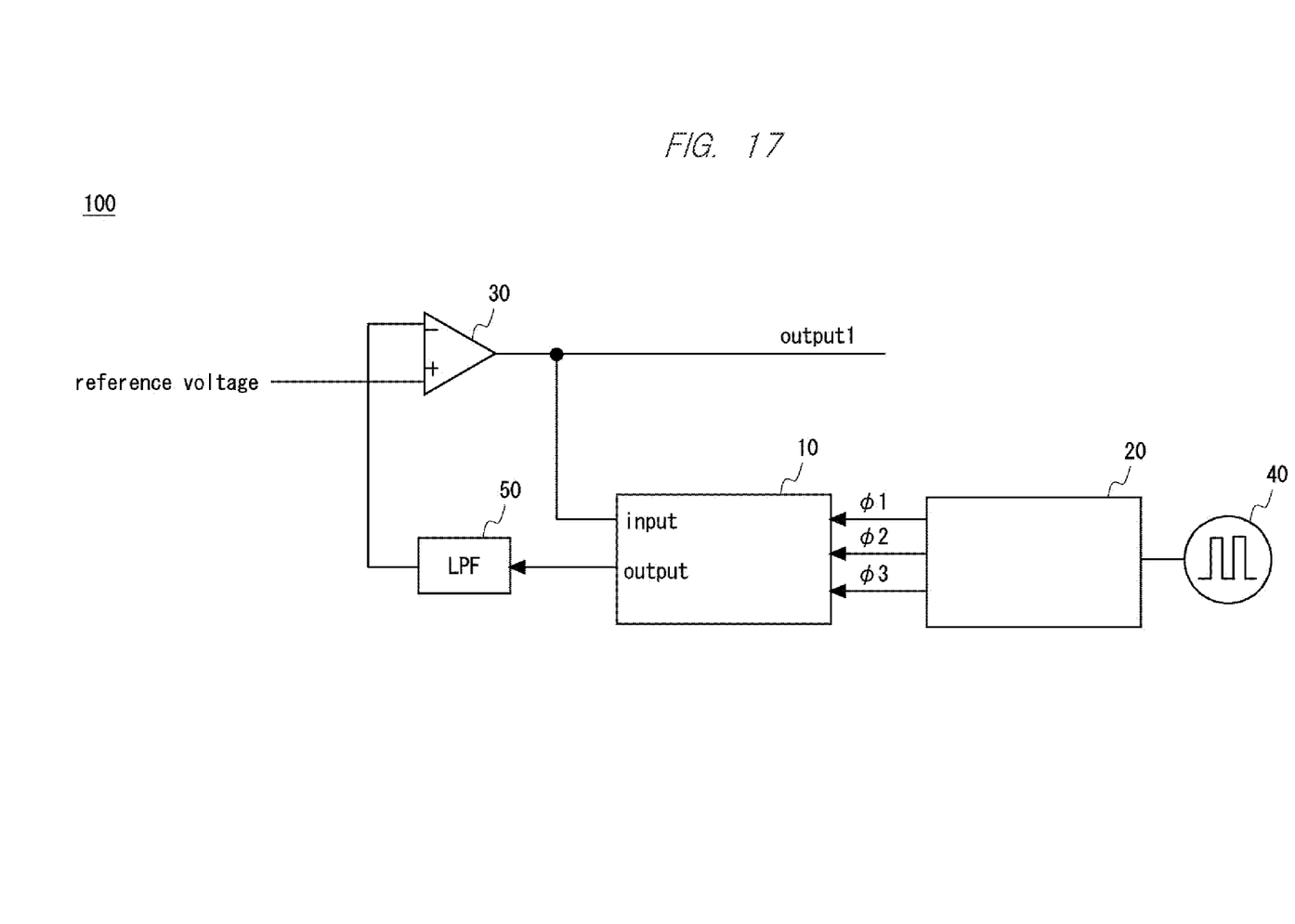
FIG. 17 is a drawing showing a configuration example of the negative feedback circuit according to the second embodiment.

FIG. 17 shows a modification example of the configuration shown in FIG. 15 in which an LPF (Low Pass Filter) 50 is added. Since the voltage divider circuit 10 intermittently compensates for the drift of the divider voltage, an oscillation of the output voltage synchronized therewith is inevitable. The output "output" of the voltage divider circuit 10 is inputted to the negative input of the operational amplifier 30 via the LPF 50. As a result, the negative feedback circuit 100 can reduce the oscillation of the output voltage synchronized with the compensation.

Similar to the voltage divider circuit according to the first embodiment, it is possible to achieve low power consumption and miniaturization of the circuit in the negative feedback circuit according to the second embodiment.

Third Embodiment

Figure 18:
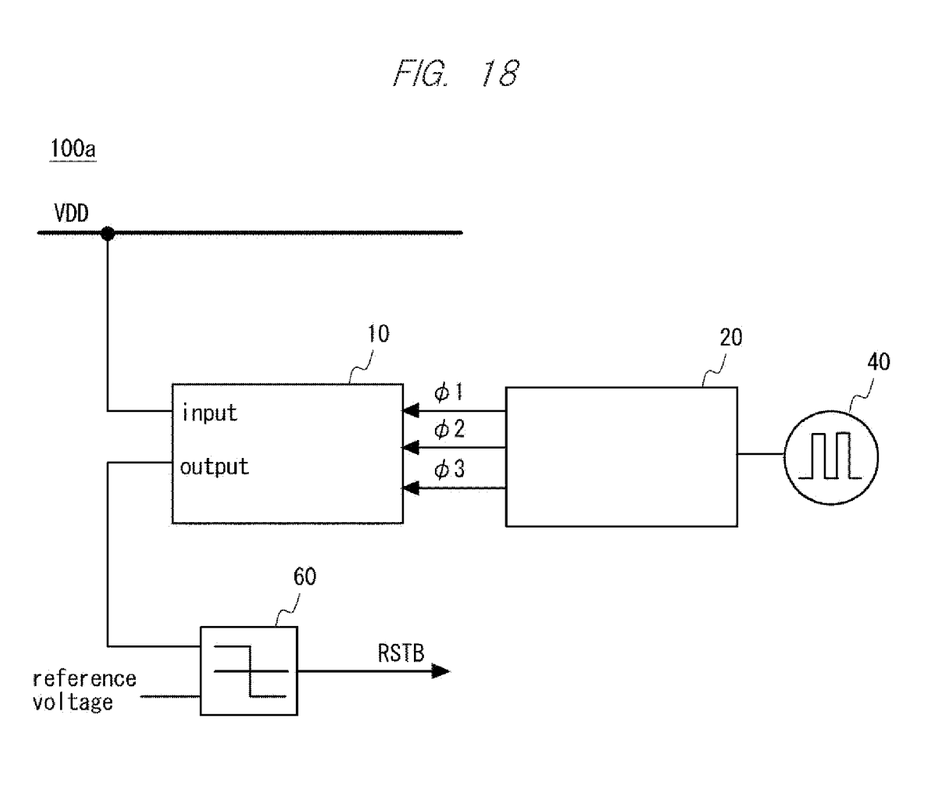
FIG. 18 is a drawing showing a configuration of a power-ON reset circuit according to a third embodiment.

FIG. 18 is a configuration diagram showing a configuration of a power-ON reset circuit 100a using the voltage divider circuit 10. In the description of the third embodiment, components equivalent to those of the first and second embodiments are denoted by the same reference signs, and redundant descriptions thereof are omitted as appropriate. The power-ON reset circuit 100a according to the third embodiment comprises the voltage divider circuit 10, the controller 20, and a comparator 60.

The voltage divider circuit 10 divides a power-supply voltage VDD, and inputs it to the comparator 60 as the divider voltage. The comparator 60 compares the divider voltage inputted from the voltage divider circuit 10 and the reference voltage, and generates a reset signal RSTB according to the comparison result.

Since the voltage divider circuit 10 intermittently compensates for the drift of the capacitor voltage, an oscillation of the output voltage of the power-ON reset circuit 100a synchronized therewith is inevitable. The comparator 60 may have hysteresis characteristics to prevent chattering of the reset signal RSTB caused by this oscillation.

Similar to the voltage divider circuit according to the first embodiment, it is possible to achieve low power consumption and miniaturization of the circuit in the power-ON reset circuit according to the third embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the voltage divider circuit according to the above-described embodiments may have a configuration in which the semiconductor substrate, the semiconductor layer, the diffusion layer (diffusion area) and the like have opposite conductivity types (p type or n type). Therefore, in a case where the first conductivity type is one of the n and p types, and the second conductivity type is the other of the n and p types, the first conductivity type can be the p type while the second conductivity type is the n type, or conversely, the first conductivity type can be the n type while the second conductivity type is the p type.

What is claimed is:

1. A voltage divider circuit comprising:
   a first voltage divider including: a first capacitor and a second capacitor connected in series between an input potential and a reference potential; and an output node configured to output a divider voltage from between the first capacitor and the second capacitor;
   a second voltage divider including: a third capacitor and a fourth capacitor having substantially the same capacitance ratio as the first capacitor and the second capacitor; a first switch; a second switch connected in parallel to the third capacitor; and a third switch connected in parallel to the fourth capacitor, the third capacitor, the fourth capacitor and the first switch being connected in series and being connected in parallel to the first voltage divider; and
   a fourth switch provided between the output node and a connection node of the third capacitor and the fourth capacitor,
   wherein, in a first period, the first switch is controlled in a non-conductive state, the second switch and the third switch are controlled in a conductive state, and the fourth switch is controlled in a non-conductive state,
   in a second period after the first period, the first switch is controlled in a conductive state, the second and third switches are controlled in a non-conductive state, and the fourth switch is controlled in a non-conductive state,
   in a third period after the second period, the first switch is controlled in a conductive state, the second switch and the third switch are controlled in a non-conductive state, and the fourth switch is controlled in a conductive state, and
   in a fourth period after the third period, the first switch is controlled in a conductive state, the second switch and the third switch are controlled in a non-conductive state, and the fourth switch is controlled in a non-conductive state.

2. The voltage divider circuit according to claim 1,
   wherein each of the first and second capacitors are constituted by an n number (where n is an integer of two or more) of capacitors connected in parallel,
   each of the n number of nodes connecting the n number of capacitors constituting the first capacitor and the n number of capacitors constituting the second capacitor is connected to an adjacent node via a switch, and
   the switch is controlled in the same conductive state as the fourth switch.

3. The voltage divider circuit according to claim 1,
   wherein the first capacitor and the second capacitor are MOS capacitors constituted by MOS (Metal Oxide Silicon) transistors.

4. The voltage divider circuit according to claim 3,
   wherein the first capacitor is a MOS capacitor constituted by a MOS transistor of a first conductivity type, and the second capacitor is a MOS capacitor constituted by a MOS transistor of a second conductivity type opposite to the first conductivity type, and
   the output node is a node in which a gate of the MOS transistor of the first conductivity type and a gate of the MOS transistor of the second conductivity type are connected.

5. The voltage divider circuit according to claim 3,
   wherein the third capacitor and the fourth capacitor are MOM (Metal Oxide Metal) capacitors.

6. A negative feedback circuit comprising a voltage divider circuit according to claim 1 and an operational amplifier,
   wherein an output voltage of the operational amplifier is inputted to the voltage divider circuit as the input potential, and a voltage divided by the voltage divider circuit is inputted to a negative input terminal of the operational amplifier.

7. A power-ON reset circuit comprising a voltage divider circuit according to claim 1 and a comparator,
   wherein the voltage divider circuit is configured to divide a power-supply voltage and output it as a divider voltage, and
   the comparator is configured to compare the divider voltage and a reference voltage and generate a reset signal according to the comparison result.

* * * * *